United States Patent [19]

Priscsak

[11] 4,447,945
[45] May 15, 1984

[54] CUT AND CLINCH MECHANISM FOR USE IN ELECTRICAL COMPONENT ASSEMBLY APPARATUS

[75] Inventor: Istvan Priscsak, New Fairfield, Conn.

[73] Assignee: Contact Systems, Inc., Danbury, Conn.

[21] Appl. No.: 411,677

[22] Filed: Aug. 26, 1982

Related U.S. Application Data

[63] Continuation of Ser. No. 145,794, May 1, 1980, abandoned.

[51] Int. Cl.³ .............................................. H05K 3/30
[52] U.S. Cl. ..................................... 29/566.3; 29/739; 140/105
[58] Field of Search ................... 29/566.1, 566.3, 715, 29/739, 741; 140/93 D, 105; 409/221

[56] References Cited

U.S. PATENT DOCUMENTS

| 2,893,010 | 7/1959 | Stuhre | 29/741 X |
| 3,414,024 | 12/1968 | Anderson et al. | 29/741 X |
| 4,135,558 | 1/1979 | Ragard et al. | 140/105 |
| 4,153,082 | 5/1979 | Foley | 140/105 |
| 4,211,512 | 7/1980 | Zankl | 409/221 |

Primary Examiner—Z. R. Bilinsky

[57] ABSTRACT

The lead of an electrical component that extends from the bottom of a printed circuit board that is being assembled is inserted through an aperture in a fixed, rigid cutting finger. A cutting sleeve fits over the finger and is rotatable coaxially thereabout. A cutting blade on the rotatable sleeve wipes past the aperture and cuts the lead. As the blade cuts the lead it also clinches, or bends, the lead toward the bottom of the circuit board. Two such mechanisms operate simultaneously to cut and clinch both leads of an electrical component such as a capacitor or resistor.

14 Claims, 8 Drawing Figures

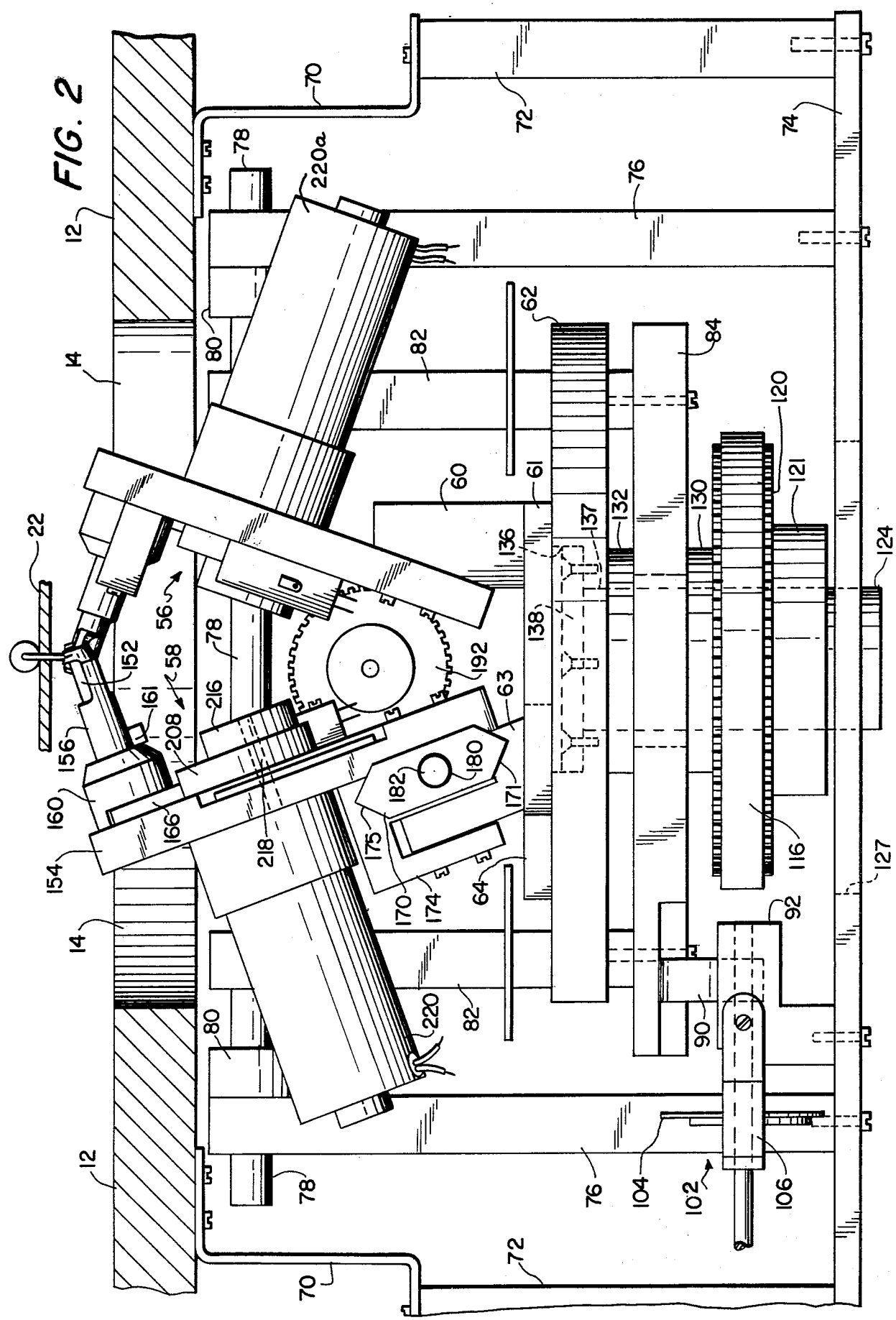

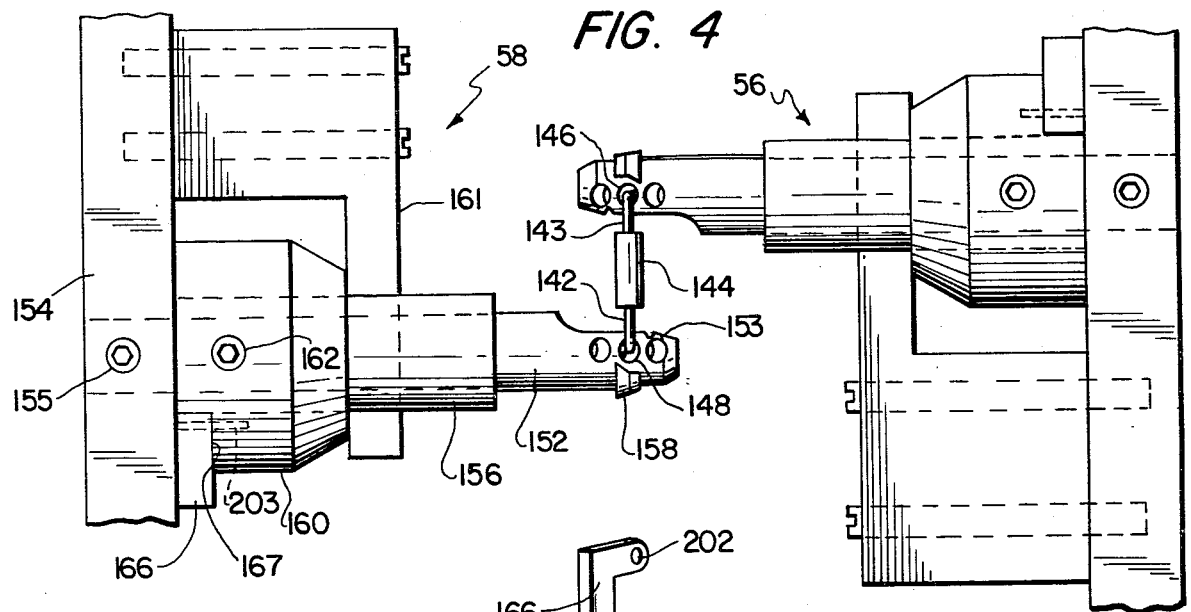
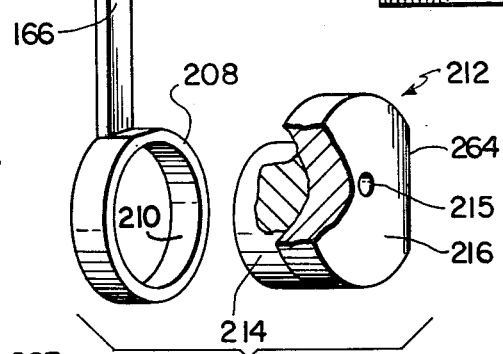
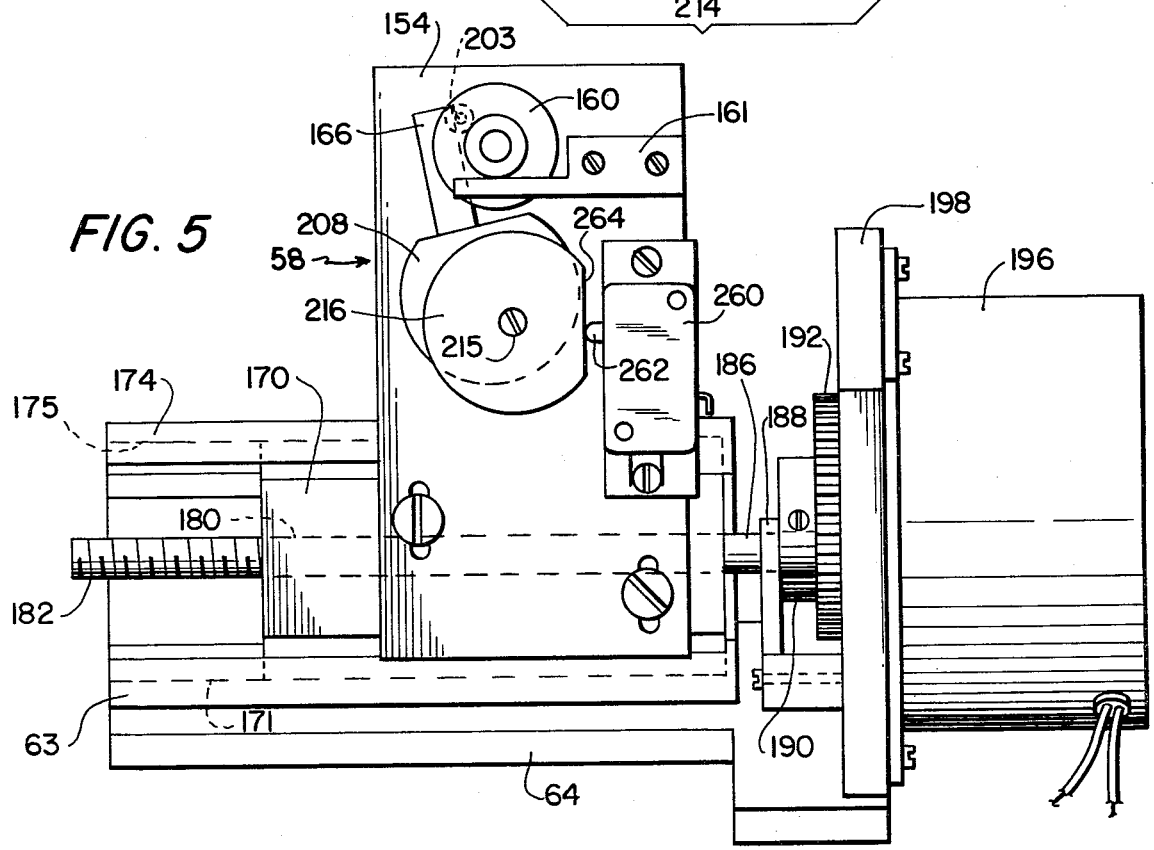

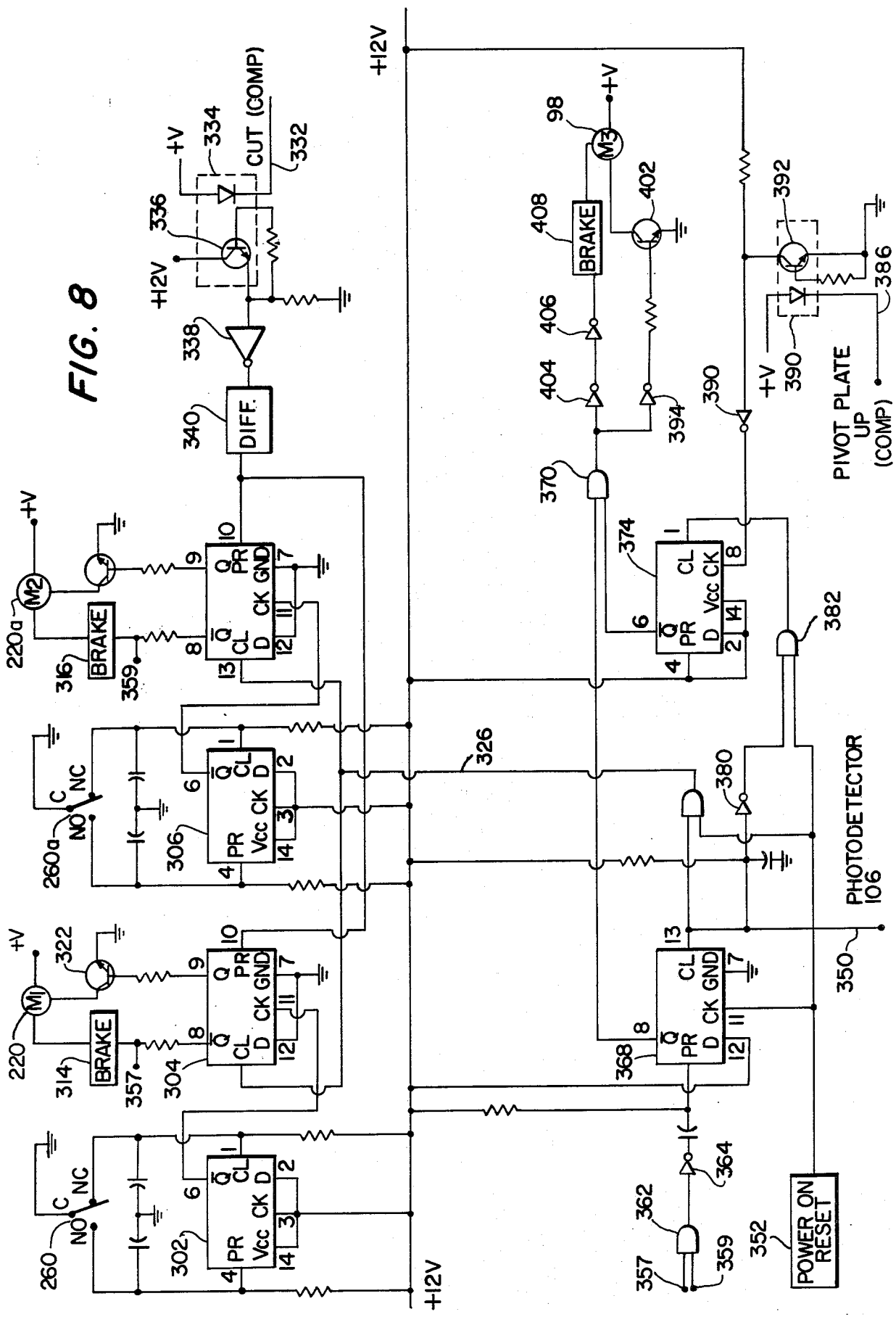

CUT AND CLINCH MECHANISM FOR USE IN ELECTRICAL COMPONENT ASSEMBLY APPARATUS

This application is a continuation of application Ser. No. 145,794, filed May 1, 1980.

This invention relates to mechanisms for use in apparatus for assemblying electrical components on printed circuit boards. More particularly, the invention relates to novel mechanisms for cutting the component leads, or terminals, that extend through the circuit board and for automatically clinching, or bending, short tabs of the leads back toward the bottom surface of the circuit board to positions that are suitable for soldering of the leads to conductors that are printed on the board.

A number of machines are known that automatically cut and clinch electrical component leads that have been inserted through apertures in printed circuit boards. Various different operating principles have been utilized to cut and clinch the leads that extend from the bottom of the board. Many of the prior art mechanisms require rather complex mechanical linkages, drives, slides, etc., that not only are expensive to manufacture, but are costly to service and maintain. Additionally, some of the known cut and clinch mechanisms require that the component leads be rather carefully bent to predetermined spacings, and that the leads as received from the supplier be trimmed to given lengths before they can be used in the cut and clinch apparatus. The above unfavorable characteristics add to the cost of the apparatus and to the cost of the completed circuit boards.

BRIEF DESCRIPTION OF THE DRAWINGS

The invention will be described in connection with the accompanying drawings wherein:

FIG. 2 is an illustration of the cut and clinch mechanism of this invention mounted in position under the table of the console of FIG. 1;

FIG. 4 is a simplified illustration showing an electrical component with its leads in a pair of cut and clinch mechanisms, the circuit board being omitted in order to simplify the drawing;

FIG. 5 is an illustration of the actuation means and translation means for the movable cut and clinch mechanism of this invention;

FIG. 6 is a detailed illustration of the crank mechanism for rotating the cutting blade of the cut and clinch mechanism;

FIG. 8 is a simplified schematic diagram and wiring diagram of the portion of the control system that controls the rotations of the cutting sleeves and the up-down motion of the cut and clinch mechanisms.

DETAILED DESCRIPTION OF PREFFERED EMBODIMENT

Figure 1:
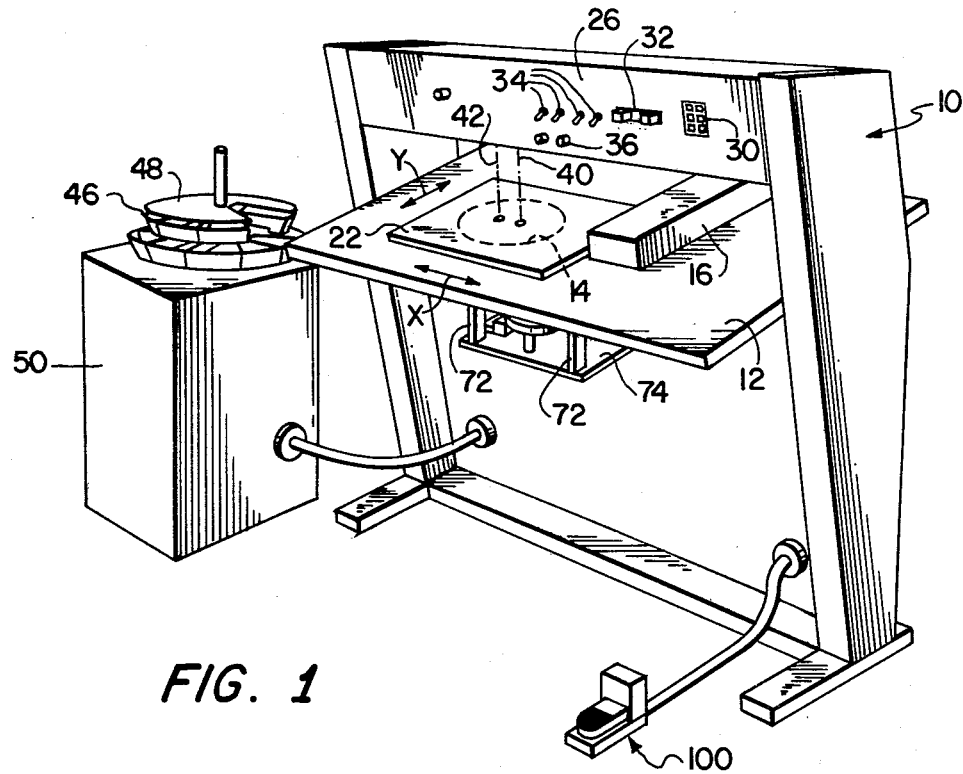
FIG. 1 is a simplified illustration of a console that includes an automatic component locator for directing an operator where to insert an electrical component into predrilled drilled holes in a printed circuit board, and further illustrates the cut and clinch mechanism of this invention located under the table on the console in order to operate on the component leads that have been inserted through the printed circuit board.

FIG. 1 is a simplified illustration of a work station at which electrical components are assembled onto a printed circuit board. The station is comprised of a console 10 having a table top 12 supported thereon. The table top has a circular aperture 14, shown in broken lines, that extends completely therethrough. An x-y plotter mechanism 16 includes means (not illustrated) for supporting one or more rigid printed circuit boards 22 and for moving given points on the board 22 to predetermined x and y coordinate positions relative to the fixed table top 12 in accordance with a programmed routine. x-y plotter mechanism 16 is under control of a programmed control system of the microcomputer type, for example, that is located within cabinet 26 at the top of console 10. A keyboard 30, pushbuttons 32, toggle switches 34, and rotary knobs 36 are provided for programming and operating the control system. Digital controlled x-y plotters, or tables are well known to those skilled in the art and are commercially available. Consequently, the x-y plotter 16 will not be further described.

Console 10 includes an optical system that is housed in cabinet 26 and which projects two small diameter beams of light 40 and 42 onto the surface of circuit board 22. One of the beams is fixed in position and the other one is movable in position under control of another x-y plotter in cabinet 26. The light spots on the printed circuit board direct the operator where to insert the leads of an electrical component such as a resistor or capacitor that is being assembled onto board 22. The movement of the movable light beam is under control of the microcomputer and is programmed in cooperation with the movement of printed circuit board 22 to sequentially direct the operator through a sequence of component insertions. A rotary bin 46 positioned adjacent console 10 includes a number of compartments that contain different electrical components, such as resistors and capacitors, that have different values and different sizes. A rotary cover 48 on each tier of compartments permits selective access to only one compartment at a time. A control system for rotary bin 46 is housed within pedestal cabinet 50. The control system of rotary bin 46 is in turn controlled by the microcomputer control system in cabinet 26. Rotary bin 46 and its cover 48 function in synchronism with the movement of the movable light beam 40 or 42 and with the movement of printed circuit board 22 to make available to the operator only the compartment in rotary bin 46 that contains the correct component that is to be inserted next.

Systems operating as described are commercially available. One example of such a system is the CS-400 Component Locator, available from Contact Systems Inc., Danbury, Conn. Another system of this type is described in U.S. Pat. Nos. 3,852,865 and 3,859,707.

After the operator inserts a component into predrilled holes in the printed circuit board the component leads are extending downwardly from the bottom of the board. In accordance with this invention, novel apparatus is provided for cutting off the leads to predetermined lengths and then bending the cut leads inwardly toward the bottom surface of the circuit board so that they hold the component on the board and are suitably positioned for soldering. This operation shall be called cutting and clinching of the leads. In FIG. 1, the cut and clinch mechanism is securely attached to the bottom of table top 12 under the circular aperture 14.

The cut and clinch mechanism of this invention is illustrated in detail in FIGS. 2–7 of the accompanying drawings. In FIG. 2, table top 12 is illustrated at the top of the drawing. The cutting and clinching operations are performed by a stationary cut and clinch mechanism 56 and a movable cut and clinch mechanism 58. Stationary mechanism 56 is secured to a mounting block 60 which in turn is secured to a base 61. Base 61 is fixedly attached to a rotatable turntable 62. Movable cut and clinch mechanism 58 is slidably mounted on a support block 63 which in turn is fixed to base 64. Base 64 is fixedly attached to rotatable turntable 62.

Figure 3:
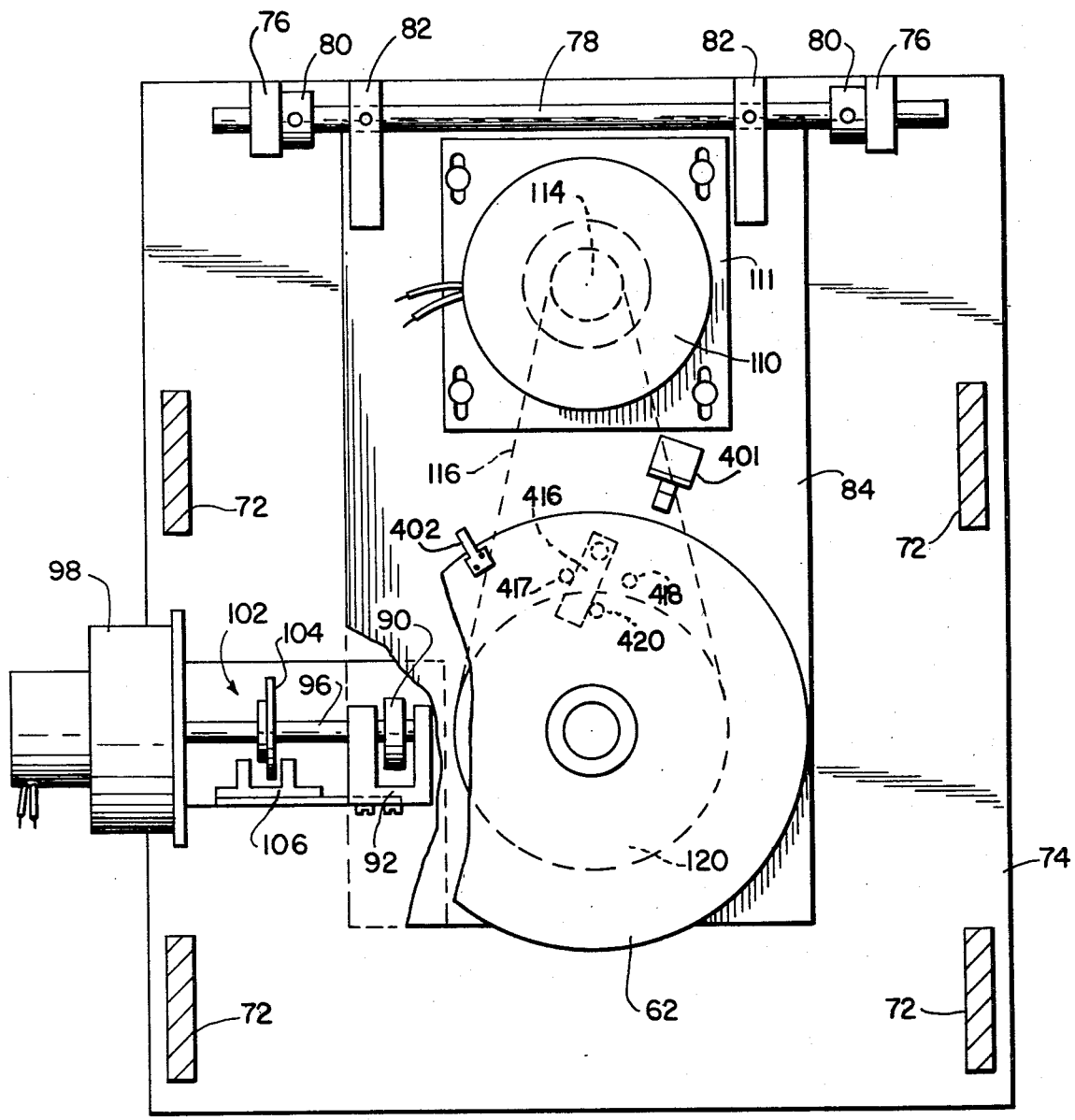
FIG. 3 is a simplified illustration, with portions removed and portions broken away, of the means for positioning the cut and clinch mechanism to programmed orientations for performing the desired operations on component leads.

Before describing the cut and clinch mechanisms in more detail, the manner in which they are supported under table top 12 will be described. Referring to FIG. 2 and 3, four Z-shaped metal prackets 70 are positioned at the four corners of an imaginary rectangle on the bottom surface of table top 12 and are secured thereto by bolts or screws. The lower horizontal leg of each Z-shaped bracket 70 is bolted to vertical hanger rod 72 whose lower end is bolted to a metal bottom platform 74 that is substantially horizontal. At the rear of platform 74, two spaced apart support posts 76 have their bottom ends bolted to platform 74. The upper ends of support posts 76 terminate slightly below the bottom surface of table top 12. A horizontally extending pivot rod 78 is rotatably supported between spaced support posts 76. Collars 80 are secured to pivot rod 78 by means of set screws to prevent pivot rod 78 from being withdrawn from support posts 76.

A pair of spaced hanger bars 82 are fixedly attached at their upper ends to pivot rod 78 and have their bottom ends bolted to a rigid metal pivot plate 84. It may be seen that pivot plate 84 is pivotable with pivot rod 78 by means of the pair of spaced hanger bars 82.

In the operation of the obliquely inclined cut and clinch mechanisms 56 and 58, they are raised up to the positions illustrated in FIG. 2 where they receive the component leads and then cut and clinch them. After the leads are clinched, the cut and clinch mechanisms are lowered. The raising and lowering is accomplished as follows.

Referring to FIGS. 2 and 3, horizontal pivot plate 84 is supported near its front left corner by a rotatable eccentric cam 90. Cam 90 is rotatably supported in a bearing block 92 by means of a horizontal shaft 96. Shaft 96 is coupled to electric motor 98 that is under control of a foot switch 100, FIG. 1, and the microcomputer in console 10, to rotate eccentric cam 90 between its high and low positions to thereby raise and lower pivot plate 84. A shaft angle encoder 102 that is comprised of a partially translucent code wneel 104 and a light source-detector unit 106 functions to determine the angular position of shaft 96. Bearing block 92 is secured to the bottom platform 74. Detector 106 of the shaft encoder is secured to bearing block 92.

A reversible electric stepping motor 110 on its mounting base 111 is attached to the back portion of pivot plate 84. The drive shaft of stepping motor 110 extends downwardly through an aperture in pivot plate 84 and rotates a sheave 114 that is under pivot plate 84. Sheave 114 receives a belt 116 that drives a pulley 120. As seen in FIG. 2, a split collar 121 is firmly attached to a slotted collar (not illustrated) that is an integral part of pulley 120, thereby securing pulley 120 to a rigid axial tube 124. Bottom platform 74 has an aperture 127 therethrough to provide clearance for split collar 121 and axial tube 124. Bushings 130 and 132 rotatably support axial tube 124 on pivot plate 84. Turntable 62 has concentric bores 136 and 137 at its center for receiving the top flange 138 of axial tube 124. Flange 138 is secured to turntable 62 by screws, as illustrated, so that the turntable rotates with axial tube 124.

It is thus seen that turntable 62 rotates under direct control of stepping motor 110 by way of belt 116, pulley 120, and axial shaft 124. The rotation of motor 110 in turn is under control of the programmed microcomputer in console 10, FIG. 1. The cut and clinch mechanisms 56 and 58 on turntable 62 thus are rotatable in azimuth, and in cooperation with the programmed operations of reversible stepping motor 110, the x-y table 16 that controls the position of circuit board 22, and the x-y table that positions the movable one of the light beams 40, 42, the cut and clinch mechanisms are properly oriented to receive the leads of the next component that is to be assembled onto circuit board 22.

FIG. 4 is a simplified illustration, with the circuit board and other components omitted, that illustrates how the leads 142 and 143 of component 144 are received in the respective apertures 146 and 148 of cut and clinch mechanisms 56 and 58. Apertures 146 and 148 extend completely through the respective fingers on which they are located. For reasons that will become apparent from the description below, the diameters of apertures 146 and 148 in the two cutting fingers are approximately twice the diameters of component leads that are to be cut and crimped by the mechanisms of this invention. For example, the apertures 146 and 148 may be 0.094 inch in diameter and the leads to be cut may have diameters of the order of 0.045 inch.

It is seen that there are extra apertures on both sides of apertures 146 and 148. These extra apertures are not necessary to the present invention but are useful when the leads of a DIP package are to be cut and crimped. The terminals of the DIP package that are adjacent to the terminals that are to be cut and crimped are received in the extra apertures. If DIP packages are not to be assembled onto the circuit boards, then the extra apertures are not needed and may be omitted.

Figure 7:
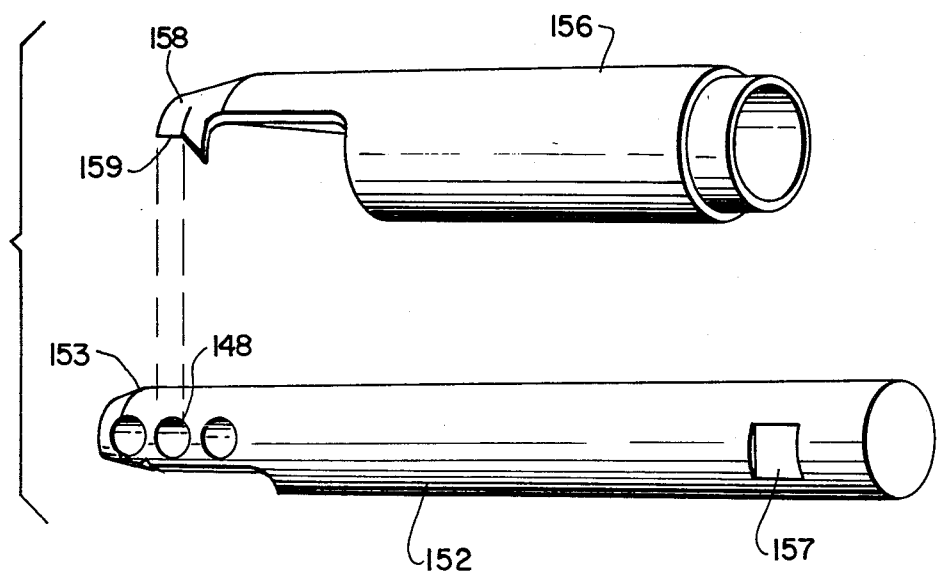
FIG. 7 is a detailed illustration of the cutting finger and cutting sleeve with its cutting blade thereon.

The projecting solid metal cutting finger 152 having the lead receiving aperture 148 in its shaped end 153 is fixedly attached to a mounting plate 154 by means of a set screw 155, for example. As seen in FIG. 7, the back end of finger 152 has a flat 157 machined on its top surface so that set screw 155 may engage flat 157 and prevent the finger from moving. A rotatable metal cutting sleeve 156 having the cutting or shearing blade 158 at its outer end is coaxially positioned on finger 152. A rotatable drive collar 160 is fixed to sleeve 156 by suitable means such as set screw 162. Collar 160 and sleeve 156 are rotatable held on finger 152 by means of a collar stop member 161 that is bolted to mounting plate 154. Stop member 161 has a stem that butts against the front surface of rotatable collar 160, thereby holding the collar on finger 152 and permitting the collar to rotate. A crank arm 166 is pivotally attached to the rear of a cut-out segment 167 on collar 160, as illustrated in FIG. 5, so that when crank arm 166 reciprocates up and down, by means to be described below, the coaxial sleeve 156 and its cutting blade 158 rotate across the top of the shaped end 153 of finger 152. This causes cutting blade 158 to bend and then cut the component lead that is positioned within aperture 148 of the finger. Aperture 148 is made larger than the lead 142 not only to permit easy registration but to permit the lead to bend and thus begin the crimping action.

The movable cut and clinch mechanism 58 may have to be moved toward or away from the fixed mechanism 56 to assure that they are properly spaced to receive the leads of the next component that is to be inserted into the circuit board. As seen in FIGS. 2 and 5, the mounting plate 154 on which the cutting finger 152 and cutting sleeve 156 are mounted is bolted to a movable carriage block 170 that has a V-shaped top and bottom. Support block 63 has a V-shaped way 171 machined therein for slidably receiving the bottom edge of carriage block 170. An upper way block 174 has a V-shaped way 175 machined therein for slidably receiving the upper edge of carriage block 170. Carriage block 170 has a threaded bore 180 extending longitudinally through its mid region and a lead screw 182 is threadably engaged within bore 180. As seen in FIG. 5, the right end 186 of lead screw 182 is not threaded and is supported by a bearing bracket 188. The extreme right end of lead screw 182 is securely attached to and rotated by a driven gear 190 that is coupled to a flat gear 192 that in turn is secured to the output shaft of an electrical stepping motor 196 that is reversible in direction of rotation. Motor 196 is secured to a mounting plate 198 whose bottom edge is secured to base 64 that attaches to the rotatable turntable 62.

Stepping motor 196 operates in response to commands from the microcomputer control system in console 10, FIG. 1, to rotate lead screw 182 and thereby translate carriage block 170 longitudinally in the way blocks 63 and 174. The position of movable cut and clinch mechanism 58 is thus controllable to provide the proper spacing between it and the fixed cut and clinch mechanism 56 so that the leads of the next component that is inserted into the circuit board will be properly received in the apertures 146 and 148 in the cutting fingers.

The details of how cutting sleeve 156 and its cutting blade 158 are caused to rotate now will be described, still using the movable cut and clinch mechanism 58 as the example. As seen in FIG. 6, crank arm 166 has an aperture 202 through which a pivot pin 203, FIGS. 4 and 5, passes. The pivot pin is secured in cut-out segment 167 on the back side of drive collar 160 so that crank arm 166 is pivotally joined to collar 160. Crank arm 166 is an integral part of cam follower collar 208 which has a circular aperture 210 symmetrically located therein. A one-piece eccentric cam member 212, FIG. 6, includes a front eccentric 214 which is nonsymmetrical with respect to axial bore 215 that extends through the one-piece member 212. The back circular cam 216 is symmetrical with respect to axial bore 215. The eccentric 214 is rotatably received within aperture 210 of cam follower collar 208. The rotatably engaged cam follower collar 208 and one-piece eccentric cam member 212 are positioned on the front of mounting plate 154, FIG. 2. The output shaft 218 of d.c. motor 220 is fixedly secured in axial bore 215 of the symmetrical circular cam 216. As motor shaft 218 turns, eccentric cam 214 will rotate within cam follower collar 208 and cause the collar to rise and fall. This causes crank arm 166 to reciprocate up and down and causes collar 160 to rotate back and forth.

Because collar 160 is fixed to cutting sleeve 156 the sleeve and its cutting blade 158 rotate coaxially back and forth about cutting finger 152. As cutting blade 158 passes over aperture 148 in the shaped end of cutting finger 152, the cutting edge 159 engages the vertical portion of the flexible lead 142 and first pushes the lead up against the far side of the aperture. The lead is caught between the cutting edge 159 of blade 158 and the sharp top edge of aperture 148. Further rotation of cutting blade 158 of sleeve 152 cuts through the lead. As illustrated, a portion of the cutting edge may be inclined in order to urge the lead into the desired position before the cutting actually begins. Because cutting blade 158 has thickness to it, further travel of the blade beyond the back edge of aperture 148 pushes the severed lead 142 inwardly so as to crimp it to the circuit board 22. Cut and crimp mechanisms 56 and 58 receive operating commands at the same time so that they cut and crimp their respective leads at the same time.

The leads that are cut and clinched in the manner described may be substantially any length because they pass freely through apertures 146 and 148 in the cutting fingers and are not obstructed on the bottom side thereof. All that the operator need do is to insert the leads, as supplied by the manufacturer, through the pre-drilled holes in the circuit board.

The outer ends of the obliquely inclined cutting fingers are relatively small and can fit closely together, thereby to present a small "footprint" on the underside of the circuit board. This is advantageous because the cutting fingers will be less likely to strike already inserted and crimped leads, thereby minimizing the possibilities of forming solder bridges when the leads are soldered, as by wave soldering.

From the above description it can be understood how the coaxially disposed cutting sleeves are rotated on their respective cutting fingers to cut and clinch the component leads. The control system that actuates the two mechanisms now will be briefly explained.

In order to control the cut and clinch mechanism there must be some means to know where various component parts are at different times in an operating cycle. The positions of the cutting sleeves are determined by means of precision snap switches such as snap switch 260, FIG. 5. that is secured to mounting plate 154. The actuator 262 of the switch is adjacent a flat segment 264 on the back circular cam 216. When actuator 262 is on flat segment 264 the switch is in its normal condition wherein its terminals are as designated. That is, terminal C is the common terminal; NO is the normally open terminal, and; NC is the normally closed terminal. When circular cam 216 is rotated so that actuator 262 is moved inwardly as it rides on the higher circular segment of the cam, the switch is actuated and the conditions of the NO and NC terminals will reverse, as is well understood in the art.

Because circular cam 216 is part of the one-piece eccentric cam member 212 that causes cutting sleeve 156 to rotate on cutting finger 152, the condition of the terminals of switch 260 indicates the position of cutting sleeve 156 and its cutting head 158.

Both cut and clinch mechanisms have identical snap switches operating off the respective back circular cams of the respective one-piece eccentrics.

The angle shaft encoder 102 and the light source-detector 106, FIG. 3, provide means for determining the position of eccentric cam 90, thus providing information as to whether pivot plate 84 is up or down. For example, the light source-detector may be blocked by code wheel 104 and one output signal is produced when pivot plate 84 is in one position. The photodetector 106 would not be blocked by code wheel 104 when eccentric 90 and pivot plate 84 are in their opposite positions, thus producing an opposite output signal. A translucent mask of approximately 180° on code wheel 104 will provide the desired operation described above. Having described how the local position signals are derived, the manner in which they are utilized to control motors 98, 220, and 220a now will be described, reference being made to the simplified schematic and wiring diagram of FIG. 8.

Motors M1 and M2 in FIG. 8 are the d.c. motors 220 and 220a that rotate the respective cutting sleeves 156 and 156a of the movable and fixed cut and clinch mechanisms 58 and 56. Switches 260 and 260a are the respective precision snap switches that are actuated by the cams 216 and 216a in response to rotation of motors 220 and 220a. Motor M3 is motor 98, FIG. 3, that rotates eccentric cam 90. In FIG. 8, the output of photodetector 106 is lead 350.

Integrated circuits 302, 304, 306, 368, and 374 are flip flops, type 74C74, that are commercially available. Motor brake circuits 314 and 316 are electronic brake circuits that operate to immediately stop the rotors of their respective motors. A high signal to those brake circuits causes the armature winding of the motor to be shorted, thus substantially instantaneously locking, or braking the rotor. A low signal to one of the brake circuits disables the brake and allows the respective motor to rotate if it is energized. Electronic brake circuits are well known and can be purchased commercially.

In the illustrated positions of switches 260 and 260a in FIG. 8, both switches are closed on their normally closed contacts NC, thus connecting those contacts to ground. Because the controls of both motors 220 and 220a are identical, only the control for motor 220 will be described in detail. Initially it will be assumed that pivot plate 84 is in its up position so that the cut and clinch mechanisms are properly located to perform their functions. The condition of switch 260 illustrated in FIG. 8 occurs when its actuator 262 is on the flat segment 264 of circular cam 216, FIG. 5. This puts a low signal on the CL input of flip flop 302 and its $\overline{Q}$ output is high. This high is coupled to the CK input of flip flop 304. Initially it is assumed that the Q output of flip flop 304 is low. This low on the base electrode of transistor 322 keeps the transistor off, thereby deenergizing motor 220. The $\overline{Q}$ output of flip flop 304 is high, thereby coupling a high to brake circuit 314 to activate that circuit and apply a braking action to motor 220. As will be explained below, when pivot plate 84 is up in its cutting and clinching position illustrated in FIG. 2, the signal on lead 326 is high, thereby applying a high signal to the CL input of flip flop 304.

When the cut and clinch mechanisms are to perform their operations, a low cut signal is coupled from the microcomputer control system onto input line 332 of opto-isolator 334, thereby causing its light emitting diode to conduct and causing transistor 336 to conduct. This couples a high signal to inverter 338. The negative going output signal from inverter 338 is differentiated in differentiator 340 whose output is a negative going signal to the PR input of flip flop 304, thereby causing the Q output to go high and the $\overline{Q}$ output to go low. Transistor 322 now conducts to energize motor 220 and the low signal to brake circuit 314 disables the brake. Motor 220 now turns and causes cutting sleeve 156 to begin its rotary cutting motion, as described above.

When motor 220 begins to rotate, actuator 262 on snap switch 260, FIG. 5, is pushed in by the high segment on circular cam 216, thereby causing the NC contact to open and the NO contact to close on the common contact. This causes the $\overline{Q}$ output of flip flop 302 to go low. This low is coupled to the CK input of flip flop 304 but nothing happens because only a low-to-high transition to the CK input of flip flop 304 will cause it to change states, with the conditions presently assumed.

When circular cam 216, FIG. 5, has substantially completed one revolution, during which cutting edge 159 has wiped past aperture 148 in cutting finger 152 and then withdrawn to its starting position, the flat segment 264 on cam 216 again is in the position illustrated in FIG. 5. This allows actuator 262 to be released and switch 260 transfers to the condition illustrated in FIG. 8. This puts a low signal on the CL input of flip flop 302 and causes its $\overline{Q}$ output to go high. This low-to-high transition on the CK input of flip flop 304 causes it to change state, whereby its Q output goes low and its $\overline{Q}$ output goes high. Motor 220 therefore is abruptly stopped because transistor 322 is turned off to deenergize the motor and the brake is applied.

If pivot plate 84 is in its down position so that the cut and clinch mechanisms are not in position to properly receive the component leads, the signal on lead 326 is low. This puts a low signal on the CL input of motor control flip flops 304 and 308 and prevents them from changing state, thereby assuring that motors 220 and 220a of the cut and clinch mechanisms will not be actuated when pivot plate 84 is down.

The portion of the control system that controls the up and down movements of pivot plate 84 now will be described. As explained above in connection with FIGS. 2 and 3, the rotation of eccentric cam 90 on the shaft of motor 98 controls the movements of pivot plate 84. Further, the output signal of photodetector 106 is low when pivot plate 84 is down and is high when plate 84 is up in its operating position of FIG. 2.

To begin the description, first assume that pivot plate 84 is down, in which case the signal on input lead 350 from photodetector 106 is low. Also assume that power is on and the output signal from power-on reset circuit 352 is high. Also assume that the brakes are on for the cut and clinch motors 220 and 220a so that the signals on terminals 357 and 359 at the inputs to the respective brake circuits are both high.

These same terminals are shown at the lower left of FIG. 8 and couple high signals to the inputs of AND gate 362. The high output of AND gate 362 is inverted in inverter 364 and its low output is coupled to the PR input of flip flop 368. Because pivot plate 84 is assumed to be down, the signal on the CL input of flip flop 368 is low. The input on the CK terminal from power-on reset circuit 352 is high. With these conditions present the $\overline{Q}$ output of flip flop 368 is high. This high signal is coupled to the upper input of AND gate 370.

The other input to AND gate 370 also is high at this time and is produced as follows. The low signal on input terminal 350 from photodetector 106 is coupled to inverter 380 and its high output is coupled to one input of AND gate 382. The other input to AND gate 382 is high, so its output is high. This high is coupled to the CL input of flip flop 374.

With pivot plate 84 down and no UP signal on input terminal 386 from the microcomputer control system, the input to inverter 390 is high and its output is low. The CK input of flip flop 374 therefore is low.

With the assumed conditions just described, the input signals to AND gate 370 both are high and its output is high. This high is inverted in inverter 394 and is applied to the base of transistor 402 to hold it nonconductive. Motor 98 therefore is not energized.

The high output of AND gate 370 is twice inverted in inverters 404 and 406 and is applied as a high signal to electronic brake circuit 408 to lock motor 98.

Now assume that the microcomputer control system couples a low pivot plate UP signal to input lead 386. The light emitting diode of opto-isolator 390 conducts and causes the phototransistor 392 to conduct. This produces a low signal at the input of inverter 390 and a high signal is coupled to the CK input of AND gate 374. This low-to-high transition on the CK input causes the $\overline{Q}$ output to go low.

Because the two input signals to AND gate 370 now are of opposite polarity its output goes low. This low is inverted in inverter 394 and causes transistor 402 to conduct, thereby energizing motor 98.

The low output of AND gate 370 is coupled through inverters 404 and 406 and is applied to brake circuit 408 to disable the brake, thereby allowing motor 98 to rotate.

After motor 98 rotates approximately one-half turn, the pivot plate 84 is in its uppermost position and the signal on input lead 350 from photodetector 106 goes high. This high is coupled to inverter 380 and the low output thereof is coupled to AND gate 382. The output of AND gate 382 now goes low. This low is coupled to the CL input of flip flop 374 and causes the $\overline{Q}$ output to go high. This high output is applied to the lower input of AND gate 370. The other input to AND gate 370 also is high. The output of AND gate 370 therefore is high. This high is inverted in inverter 394 and a low signal is applied to the base of transistor 402 to deenergize motor 98. The high output of AND gate 370 is inverted twice and applied as a high signal to brake circuit 408 to enable it and instantaneously stop motor 98.

After pivot plate 84 is raised and its motor 98 is turned off, the cut and clinch mechanisms are operated in response to a command signal on input terminal 332, as explained above. When these motors operate, the brake signals on terminals 357 and 359 are low. This places a high on the PR input of flip flop 368 and prevents it from changing state. After the motor brake circuits 314 and 316 are again energized by the $\overline{Q}$ outputs of flip flops 304 and 308 the terminals 357 and 359 both go high. These highs are coupled to AND gate 362 whose high output is inverted by inverter 364 to a low. This transition is differentiated to a negative pulse and is coupled to the PR input of flip flop 368. This causes the $\overline{Q}$ output of flip flop 368 to go low and causes the upper input of AND gate 370 to go low. Its output goes low, is inverted to a high in inverter 394, and causes transistor 402 to conduct to energize motor 98. The low of AND gate 370 is twice inverted by inverters 404 and 406 and is coupled to brake circuit 408 to disable the brake. Motor 98 rotates and causes eccentric cam 90 to rotate, thereby lowering the pivot plate. When the pivot plate is at its low position the signal on lead 350 from photodetector 106 goes low. The circuitry of FIG. 8 responds as described above to turn off motor 98. The desired cycle of operation will repeat when another pivot plate UP signal is received on input terminal 386.

The rotation of turntable 62 is controlled by a stepping motor 110, FIG. 3, and the linear translation of the movable cut and clinch mechanism 58 is controlled by stepping motor 196, FIG. 5. Both motors operate in response to respective series of pulses that are coupled from the microcomputer control system. 200 pulses are required to rotate motor 110 one complete revolution, and 800 pulses cause turntable 62 to rotate one revolution. Motor 196, FIG. 5, makes one complete revolution in response to 24 pulses. Each pulse input to motor 196 causes movable cut and clinch mechanism 58 to move 0.005 inch. Computer controlled pulse control systems for reversible motors 110 and 196 are well known to those skilled in the art of computer controlled control systems.

Turntable 62 and movable cut and clinch mechanism 58 both have means associated therewith for indicating their positions and the limits of their movements. Light emitting diode and phototransistor detector units are used in cooperation with respective flags or masks on the movable members. These units are well known to those skilled in the art. In FIG. 3 the photodetector unit is shown at 401 and its flag is shown secured to turntable 62. Similar apparatus is employed on the movable cut and clinch mechanism, but not illustrated.

Turntable 62 has a limit stop that is illustrated in broken lines in FIG. 3. A bar 416 is pivotally attached to the bottom of turntable and is pivotable between the limit stops 417 and 418. A stop post 420 extends upwardly from the bottom platform 74. As shown in FIG. 3, turntable 62 is in its extreme counterclockwise position. Turntable 62 may be rotated clockwise to its other extreme position at which stop post 420 pushes pivot bar 416 against limit stop 418.

Although a preferred embodiment has been illustrated and described, alterations and modifications may be made without departing from the teachings of the invention, as claimed below.

What is claimed is:

1. A mechanism for cutting and clinching a terminal lead of an electrical component that extends downwardly from a circuit board onto which the component is mounted, said mechanism being below the board and comprising a rigid finger obliquely inclined to the bottom surface of said circuit board and having an end positionable adjacent said bottom surface of the board, an aperture extending transversely through said finger at or adjacent its end for receiving a thin lead of an electrical component that extends downwardly from the bottom surface of said board, the outer rim of said aperture comprising a cutting edge, a cutting sleeve coaxially disposed on said finger and adapted to rotate coaxially thereabout, a cutting blade on said sleeve, said cutting blade being positioned on said sleeve to wipe across the outer rim of said aperture in the finger when the sleeve rotates, means for rotating said sleeve coaxially around said finger, whereby a component lead in said aperture is cut or sheared when the cutting blade wipes past the aperture, said cutting blade having a thickness in the radial direction of the finger sufficient to engage the remaining end of the lead after it has been cut to bend said remaining end toward the circuit board as the cutting sleeve rotates further after the lead is cut.

2. The mechanism claimed in claim 1 wherein said aperture is larger in cross section by a factor of at least twice the diameter of a circular component lead to be inserted into the aperture.

3. The combination claimed in claim 2 wherein said means for rotating said sleeve comprises,
a crank arm,
means for pivotally coupling said crank arm to said sleeve at a location radially displaced from the axis of the sleeve,
means for reciprocating said crank arm to impart back and forth rotary motion to said sleeve.

4. The combination claimed in claim 3 wherein said means for imparting reciprocating motion to the crank arm comprises,
an electric motor having a rotary output,
a rotary cam member having a cam surface that is eccentric with respect to a transverse aperture therethrough,
the transverse aperture of said cam member being mounted on the rotary output of said electric motor,
cam follower means cooperating with the eccentric surface of said cam member and coupled with the crank arm to reciprocate the crank arm as the cam member rotates.

5. The combination claimed in claim 4 wherein said cam follower comprises,
an annular collar member,
said cam member being circular in cross section and disposed for rotation within said collar member,
said crank arm extending outwardly from said collar member.

6. The combination claimed in claims 4 or 5 and further including,
means for selectively energizing said electric motor, and
means for deenergizing said motor after said cam member makes one complete revolution,
whereby said cam member makes one revolution and imparts one out and in reciprocation to said crank arm, thereby to rotate said sleeve with one back and forth rotary motion.

7. Apparatus for cutting and clinching electrical component terminal leads that extend downwardly from a circuit board onto which the component is to be mounted, said apparatus being below the board and comprising
first and second cut and clinch mechanisms relatively movable toward and away from each other to engage said terminal leads, each said mechanism comprising
a rigid finger obliquely inclined to the bottom surface of said circuit board and having an end positionable adjacent said bottom surface of the board,
an aperture extending transversely through said finger at or adjacent its end for receiving a thin component lead that extends downwardly from the bottom of said board,
the outer rim of said aperture comprising a cutting edge,
a cutting sleeve coaxially disposed on said finger and adapted to rotate coaxially thereabout,
a cutting blade on said sleeve,
said cutting blade being positioned on said sleeve to wipe across the outer rim of said aperture in the finger when the sleeve rotates,
means for rotating said sleeve coaxially around said finger,
whereby a component lead in said aperture is cut or sheared when the cutting blade wipes past the aperture,
said cutting sleeve having a thickness in the radial direction of the finger sufficient to engage the remaining end of the lead after it has been cut to bend said remaining end toward the circuit board as the cutting sleeve rotates further after the lead is out.

8. The apparatus claimed in claim 7 and including,
means for mounting said two mechanisms in spaced apart relationship, and
means for moving one of said mechanisms toward and away from the other one along a predetermined path, whereby the spacing between apertures in said fingers may be changed.

9. The combination claimed in claim 8 wherein the means for moving one of said mechanisms includes,
a mounting block for mounting said one mechanism,
slide means secured to said mounting block,
said slide means operating to produce relative motion along said predetermined path, and
drive means coupled to said slide means for imparting relative motion thereto and moving the mounting block along said predetermined path to change the separation between said apertures in the fingers.

10. The combination claimed in claim 9 and further including,
a rotary turntable, and
said means for mounting the two mechanisms in spaced apart relationship is mounted on said turntable.

11. The combination claimed in claims 8 or 9 wherein said mechanisms are mounted relative to each other to have their fingers pointing generally toward each other.

12. The combination claimed in claim 11 wherein said means for moving one of said mechanisms toward and away from the other one moves said one mechanism in directions generally transverse to the direction its finger is pointing.

13. The apparatus claimed in claims 7 or 8 wherein,
said apertures are larger in cross section by a factor of approximately twice the diameter of circular component leads to be inserted into the apertures.

14. Apparatus for cutting and clinching electrical component terminal leads that extend downwardly from a circuit board onto which the component is to be mounted, said apparatus being below the board and comprising
first and second cut and clinch mechanisms for receiving respective leads extending downwardly from said circuit board and for cutting and clinching said leads,
at least one of said mechanisms comprising,
a rigid finger obliquely inclined to the bottom surface of said circuit board and having an end positionable adjacent said bottom surface of the board,
an aperture extending transversely through said finger at or adjacent its end for receiving a thin component lead that extends downwardly from the bottom of said board,
a cutting sleeve coaxially disposed on said finger and adapted to rotate coaxially thereabout to cut and clinch a component lead received in said aperture, means for mounting said cut and clinch mechanisms for relative movement toward and away from each other, whereby said cut and clinch mechanisms may receive component leads having different spacings therebetween, rotatable support means supporting said mounting means and adapted to rotate said cut and clinch mechanisms relative to leads extending downwardly from said circuit board, and motor means for rotating said rotatable support means.

* * * * *